(12) United States Patent
Park

(10) Patent No.: US 7,553,711 B2
(45) Date of Patent: Jun. 30, 2009

(54) METHOD FOR FABRICATING A THIN FILM TRANSISTOR FOR USE WITH A FLAT PANEL DISPLAY DEVICE

(75) Inventor: Sang-Wook Park, Daegu (KR)

(73) Assignee: LG. Display Co., Ltd., Seoul (KR)

( * ) Notice: Subject to any disclaimer, the term of this patent is extended or adjusted under 35 U.S.C. 154(b) by 342 days.

(21) Appl. No.: 11/526,453

(22) Filed: Sep. 25, 2006

(65) Prior Publication Data
US 2008/0003726 A1 Jan. 3, 2008

(30) Foreign Application Priority Data
Jun. 29, 2006 (KR) .................. 10-2006-0059975

(51) Int. Cl.
H01L 21/84 (2006.01)
(52) U.S. Cl. .................. 438/158; 438/149; 438/151
(58) Field of Classification Search .......... 438/149, 438/151, 158–160
See application file for complete search history.

(56) References Cited

U.S. PATENT DOCUMENTS

| 6,664,149 B2 * | 12/2003 | Shih | 438/151 |
| 2005/0221546 A1 * | 10/2005 | Lee et al. | 438/158 |
| 2007/0042537 A1 * | 2/2007 | Lee | 438/158 |

\* cited by examiner

*Primary Examiner*—Kiesha L Rose
*Assistant Examiner*—Daniel Shook
(74) *Attorney, Agent, or Firm*—Brinks Hofer Gilson & Lione

(57) ABSTRACT

In a fabrication method of a thin film transistor, a gate electrode is patterned with a first mask and an active pattern and a photoresist pattern are formed with a second mask. The photoresist pattern is ashed based on a predetermined width of an etch stopper. An insulating layer underlying the ashed photoresist pattern is patterned to form the etch stopper. In the fabrication method, the etch stopper may function as a passivation layer and is formed on an active layer of a thin film transistor part.

11 Claims, 5 Drawing Sheets

METHOD FOR FABRICATING A THIN FILM TRANSISTOR FOR USE WITH A FLAT PANEL DISPLAY DEVICE

PRIORITY CLAIM

The present invention claims the priority to Korean Application No. 10-2006-59975, filed on Jun. 29, 2006, which is herein incorporated by reference in its entirety.

BACKGROUND

1. Technical Field

The present invention relates to a method for fabricating a thin film transistor (TFT) for use with a flat panel display device. In particular, the present invention relates to a method for fabricating a TFT with a reduced number of masks.

2. Related Art

Image display devices for use with portable information devices are in demand. In particular, flat panel displays (FPD) replacing cathode ray tubes (CRT) are in a strong demand. A liquid crystal display (LCD) is one of the most popular flat panel displays (FPD). An LCD device displays images by using optical anisotropy of liquid crystal. An LCD device has been in use as monitors of a notebook computer and a desktop computer because it provides advantages of high resolution and good picture quality.

An LCD device includes a first substrate of a color filter substrate; a second substrate of an array substrate; and a liquid crystal layer formed between the color filter substrate and the array substrate. An LCD device is fabricated with the photolithography. The photolithography involves a plurality of mask processes for the array substrate including a thin film transistor which functions as a switching element.

FIG. 1 is a plane view illustrating some portions of a thin film transistor array substrate for use with an LCD device. In FIG. 1, a line I-I' corresponds to a thin film transistor part and a data line part, a line II-II' corresponds to a data pad part, and a line III-III' corresponds to a gate pad part.

The related art method for fabricating the LCD device may involve a number of masks, e.g., four, five, or six masks depending on model. For example, in FIG. 1, the related art method may use four masks, including (i) a first mask for forming a gate electrode 3P2, a gate line 3P and a gate pad 3P1 on a substrate 1, (ii) a second mask for forming an active layer (not shown), a data line 9P, data pad 9P1 and source and drain electrodes 9P2 and 9P3, (iii) a third mask for forming a contact hole in a passivation layer (not shown), and (iv) a fourth mask for forming a pixel electrode 15P.

A mask used in the related art fabrication method of the LCD device may be an expensive item. Production cost may substantially increase as more masks are used in the fabrication method. When a mask is used, additional process such as irradiating, stripping and cleaning follows. Accordingly, there is a need of simplifying a process for fabricating an LCD device, in particular, reducing a number of masks used in the fabrication method.

SUMMARY

In one embodiment, a method for fabricating a thin film transistor includes patterning a gate electrode with a first mask and forming an active pattern and a photoresist pattern with a second mask. The photoresist pattern is ashed based on a predetermined width of an etch stopper. An insulating layer underlying the ashed photoresist pattern is patterned to form the etch stopper. A source electrode and a drain electrode with a third mask is patterned.

In the other embodiment, a method for fabricating a thin film transistor includes forming a gate electrode on an insulating substrate, and forming an active layer and an etch stopper on the gate electrode. A metal layer is formed on an entire surface of the insulating substrate including the etch stopper. The etch stopper is exposed by selectively etching the metal layer. Source and drain electrodes are formed at both sides of the etch stopper by etching the remaining metal layer.

In another embodiment, a method for fabricating an LCD device includes preparing an insulating substrate defined with a thin film transistor part, a data line part, a gate pad part and a data pad part. A gate line is formed on the insulating substrate and the gate line includes a gate electrode formed in the thin film transistor part. A gate pad is formed in the gate pad part with a first mask. An active pattern and a photoresist pattern are formed with a second mask. The photoresist pattern is ashed based on a predetermined width of an etch stopper. An insulating layer underlying the ashed photoresist pattern is patterned to form the etch stopper. A data line is formed in the thin film transistor part, and a data pad is formed in the data pad part with a third mask. A pixel electrode connected with the drain electrode is formed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE DRAWINGS AND THE EMBODIMENTS

Reference will now be made in detail to the preferred embodiments of the present invention, examples of which are illustrated in the accompanying drawings.

Figure 1:
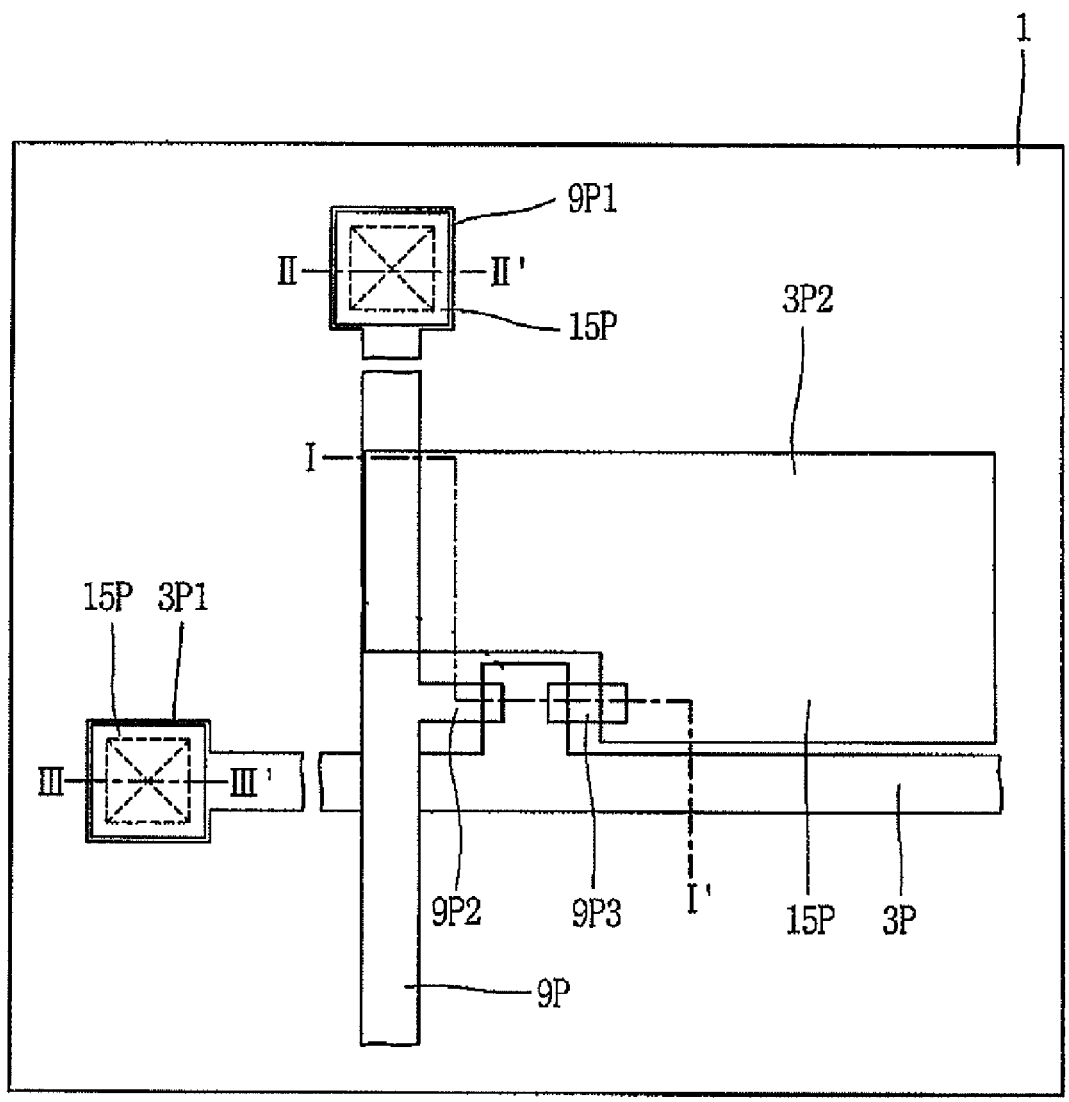
FIG. 1 is a plane view illustrating a thin film transistor array substrate according to the related art.
Figure 2:
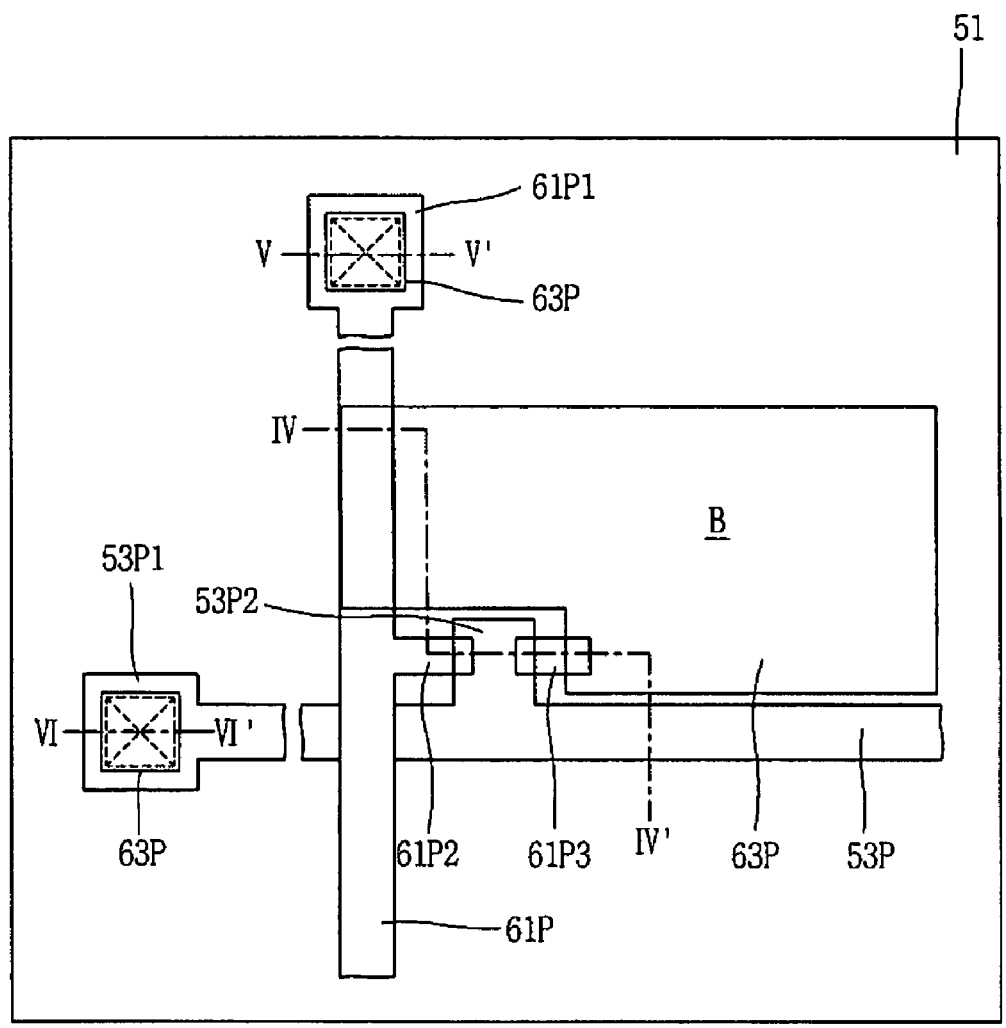
FIG. 2 is a plane view illustrating of a thin film transistor array substrate according to one embodiment of the present invention.

FIG. 2 is a plane view illustrating some portions of a thin film transistor array substrate according to one embodiment of the present invention. FIG. 2 includes the line IV-IV' which corresponds to a thin film transistor part and a data line part, the line V-V' which corresponds to a data pad part, and the line VI-VI' which corresponds to a gate pad part. FIGS. 3A to 3I are cross sectional views of illustrating a method for fabricating the LCD device using a 3-mask process, along the lines IV-IV, V-V', and VI-VI' of FIG. 2.

Figure 3A:
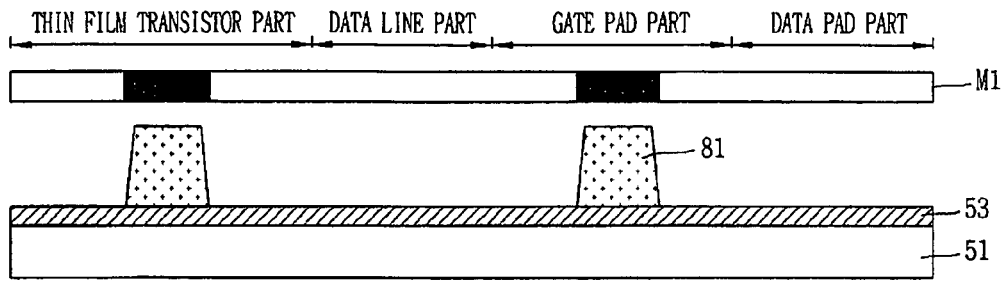
FIGS. 3A to 3I are cross sectional views illustrating a method for fabricating the thin film transistor array substrate along cross sectional lines of FIG. 2.

In FIGS. 2 and 3A, an insulating substrate 51 is provided. The insulating substrate 51 may be defined with the thin film transistor part, the data line part, the gate pad part, and the data pad part. The insulating substrate 51 is formed of a transparent material of glass. A first metal layer 53 is formed on the insulating substrate 51. The first metal layer 53 may be formed of any one selected from conductive metal materials, for example, aluminum (Al), aluminum neodymium (AlNd), tungsten (W), and chrome (Cr), or may be formed of an alloy. The first metal layer 53 may be formed with a sputtering method. A photoresist layer is applied on the first metal layer 53. Subsequently, a first mask M1 of a predetermined shape is applied and patterns the photoresist layer. As a result, photoresist patterns 81 are formed. The first metal layer 53 underlying the first patterns 81 is protected upon etching and a gate line 53P including a gate pad and a gate electrode are formed accordingly.

Figure 3B:
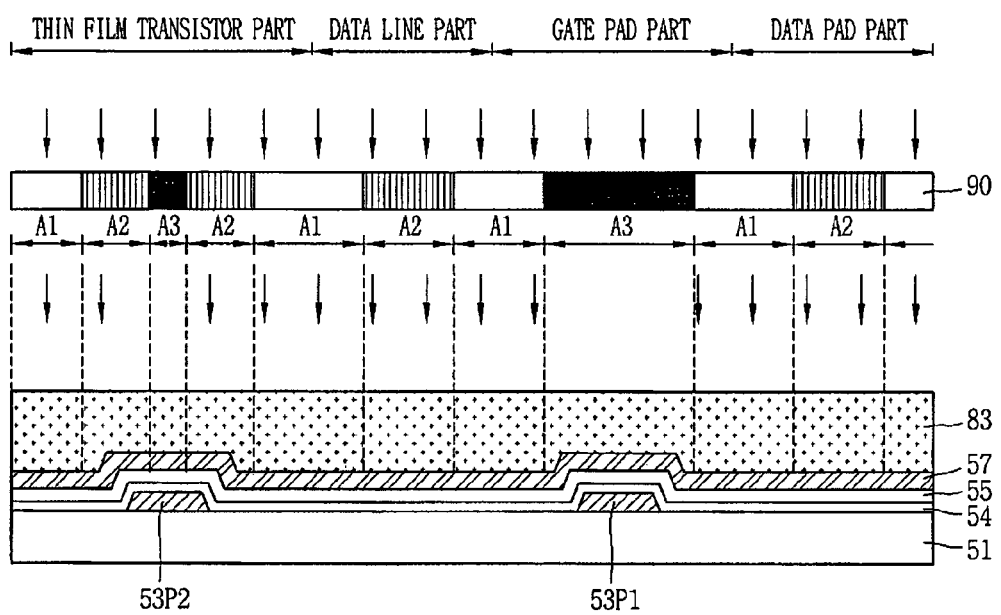

In FIGS. 2 and 3B, the patterned first metal layer 53 and the gate line 53P is formed. The gate line 53P is formed along one direction on the insulating substrate 51. At this time, a gate pad 53P1 is formed in the gate pad part corresponding to one end of the gate line, and a gate electrode 53P2 is formed in the thin film transistor part. Subsequently, the first patterns 81 are removed.

After removing the first patterns 81, an insulating layer 54, a silicon layer 55, and an etch-stopper layer 57 are sequentially formed on the insulating substrate 51 from which the first patterns 81 are removed. The insulating layer 54 may be a gate oxide layer. In other embodiment, the insulating layer 54 may be formed of a silicon nitride layer. The silicon layer 55 may be formed by sequentially depositing a first amorphous silicon layer and a second amorphous silicon layer. The second amorphous silicon layer is heavily doped with impurities. The etch-stopper layer 57 may be formed of an insulating layer. A photoresist layer 83 is coated over the insulating substrate 51 and the etch-stopper layer 57.

A second mask 90 is applied and selectively covers some portion of the photoresist layer 83. In this embodiment, the second mask 90 is a diffraction mask. In other embodiments, a half-tone mask is available. The diffraction mask includes a transmission part A1 which transmits light perfectly, a semi-transmission part A2 which transmits light partially, and a blocking part A3 which cuts off light. By using the diffraction mask as the second mask 90, the light is selectively applied to the photoresist layer 83. In other embodiments, the gate pad part may be a semi-transmission part.

Figure 3C:
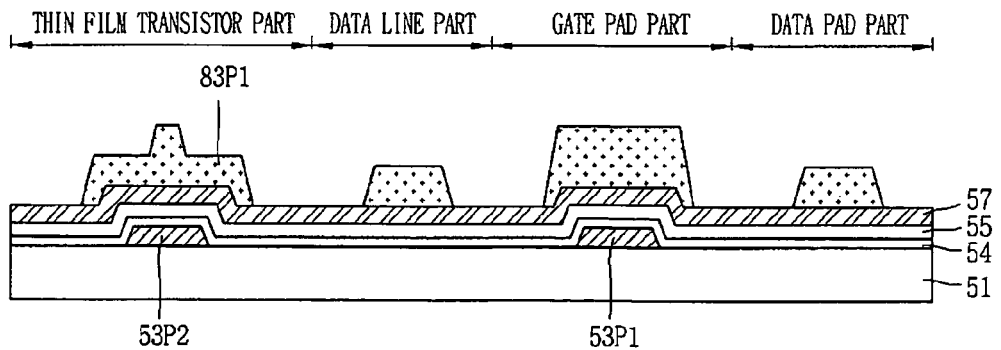

In FIGS. 2 and 3C, the photoresist layer 83 which is selectively exposed to light is patterned according to the exposure. The photoresist layer 83 corresponding to the transmission part A1 of the second mask 90 is removed completely. The photoresist layer 83 corresponding to the semi-transmission part A2 is removed partially, and the photoresist layer 83 corresponding to the blocking part A3 remains intact. As a result, second patterns 83P1 are formed (FIG. 3C). The second patterns 83P1 may be a photoresist pattern which has the different thickness. The second patterns 83P1 include the thin film transistor part. The photoresist layer 83 corresponding to the channel formation part is relatively thicker than the photoresist layer 83 corresponding to the source and drain electrodes, as shown in FIG. 3C. The second patterns 83P1 also includes the photoresist layer 83 corresponding to the gate pad part patterned to be relatively thicker, and the photoresist layer corresponding to the data line part and the data pad part patterned to be relatively thinner.

Figure 3D:
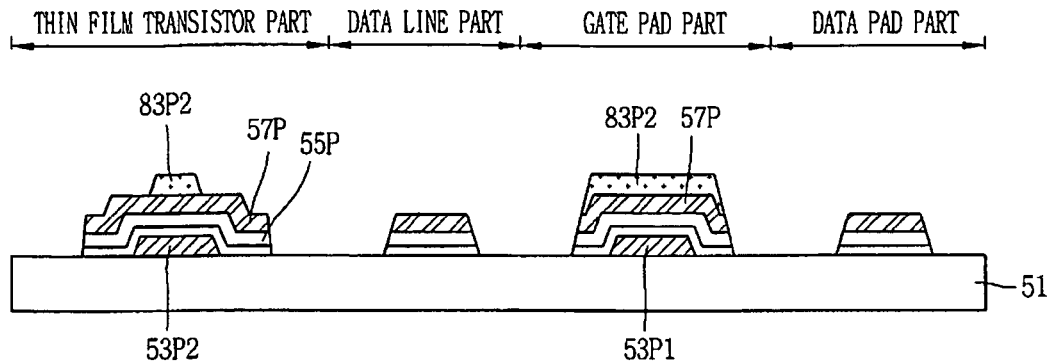

In FIGS. 2 and 3D, the etch-stopper layer 57, the silicon layer 55, and the insulating layer 54 are patterned by using the second patterns 83P1. As a result, an active layer 55P and a preliminary etch-stopper 57P are formed in the thin film transistor part. By ashing the second patterns 83P1, third patterns 83P2 are formed. The ashing process partially removes the second patterns 83P1 and the remaining portion of the second patterns 83P1 become the third patterns 83P2. The ashing process removes the second patterns 83P1 to correspond to the width of an etch stopper to be formed later. The third patterns 83P2 are selectively formed only in the channel formation portion of the thin film transistor part and the gate pad part.

Figure 3E:
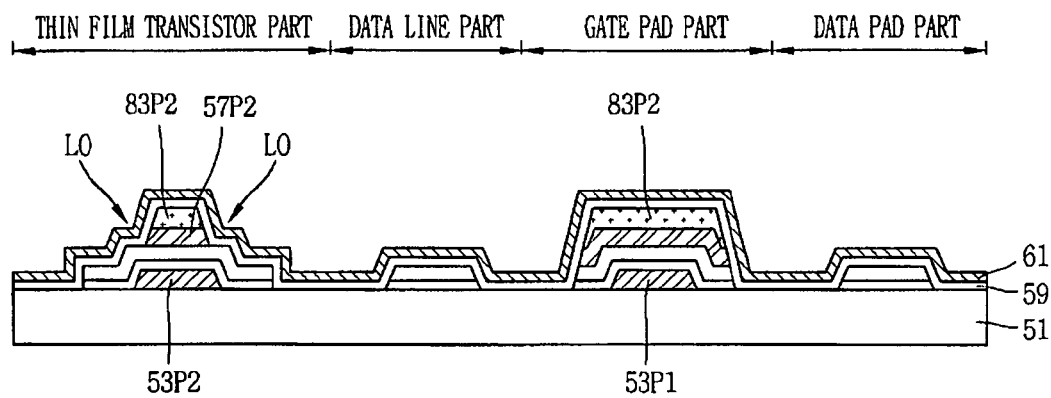

In FIGS. 2 and 3E, the preliminary etch-stopper remaining in the thin film transistor part is patterned by using the third pattern 83P2 as a mask. As a result, an etch stopper 57P2 is formed. The etch stopper 57P2 covers the channel formation portion of the thin film transistor part. Accordingly, the etch stopper 57P2 protects the channel formation portion, so that an additional process for forming a passivation layer is unnecessary. Because the gate pad part is covered with the third pattern 83P2, the gate pad part is also prevented from patterning. The data line part and the data pad part also are not covered with the third pattern 83P2. The preliminary etch-stopper 57P is completely removed.

An ohmic contact layer 59 and a second metal layer 61 are sequentially formed on the insulating substrate 51 including the third patterns 83P2 and the etch stopper 57P2. The second metal layer 61 is different in etching-selection ratio from the first metal layer 53 because the first and second metal layers are formed of the different metal materials. The second metal layer 61 is formed of any one selected from conductive metal materials, for example, molybdenum (Mo), molybdenum alloy, etc. The second metal layer 61 may be formed by using deposition or sputtering.

Figure 3F:
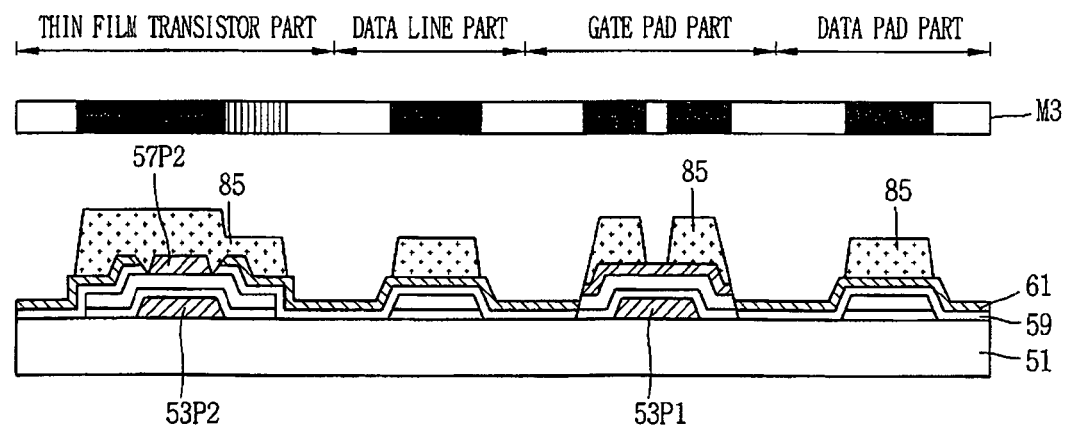

In FIGS. 2 and 3F, the second metal layer 61, and the ohmic contact layer 59 and the third patterns 83P2 are selectively removed with a lift-off process. The lift-off process removes a photoresist layer and a conductive layer such as an Indium-Tin-Oxide (ITO) on the photoresist layer. The conductive layer overlying the photoresist layer is lifted off along with the photoresist layer by developing the photoresist layer. Because the conductive layer such as an ITO is not patterned with an etching process, a mask may not be used. The lift-off process may simplify the fabrication method of the LCD device. In FIG. 3E, locations LO are selectively removed so that the third patterns 83P2 are exposed. As a result, the third patterns 83P2 and the second metal layer 61 are removed with the lift-off process.

In FIGS. 2 and 3F, a photoresist layer is formed over the insulating layer 51, the ohmic contact layer 59, the second metal layer 61 and the etch stopper 57P2. A third mask M3 of a predetermined shape such as the diffraction mask 90 is used to pattern the photoresist layer. After exposure and development, the photoresist layer is formed as fourth patterns 85. The fourth patterns 85 may have the different thickness. The formation of the fourth patterns 85 proceeds in the same method as the formation of the second patterns 83P1 (as shown in FIGS. 3B and 3C).

As a result, the fourth patterns 85 include the thin film transistor part. In the thin film transistor part, the photoresist layer corresponding to the drain electrode is relatively thinner than the photoresist layer corresponding to the channel and the source electrode. Also, the photoresist layer corresponding to the gate pad part is relatively thicker in state of having the predetermined portion being opened, and the photoresist layer corresponding to the data line part and the data pad part is relatively thinner.

Figure 3G:
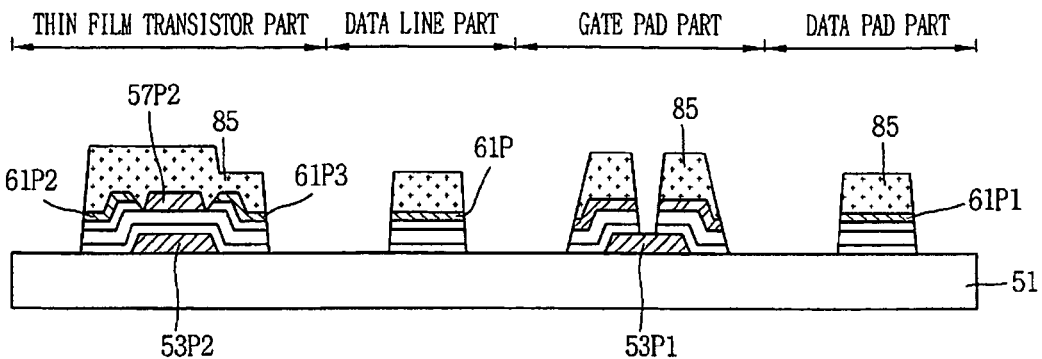

In FIGS. 2 and 3G, the remaining second metal layer 61 and the ohmic contact layer 59 are etched by using the fourth patterns 85 to form a data line 61P. The data line 61P is formed in perpendicular to the gate line 53P and a unit pixel region B is defined. A data pad 61P1 is formed in the data pad part, and source and drain electrodes 61P2 and 61P3 are formed in the thin film transistor part. The above process for patterning the remaining metal layer using the third mask is performed with a wet-etching technique.

Figure 3H:
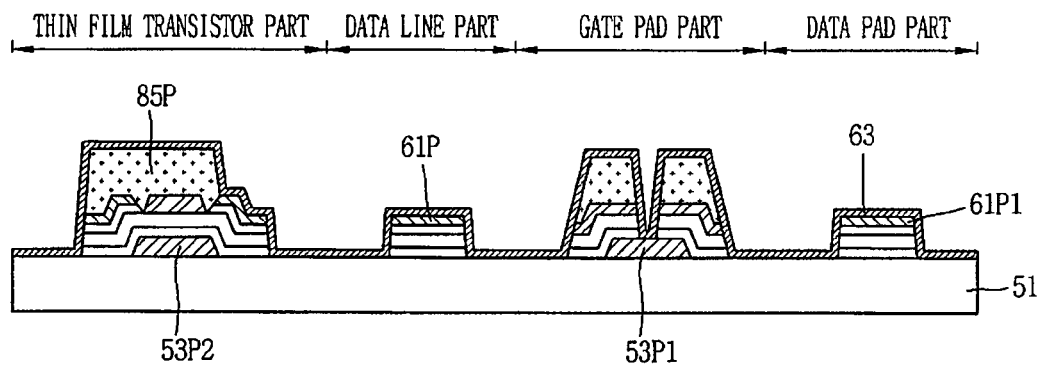

In FIGS. 2 and 3H, by ashing the fourth patterns 85, fifth patterns 85P are formed. A transparent conductive layer 63 is formed on the insulating substrate including the fifth patterns 85P. The transparent conductive layer 63 may be formed of any one of ITO or Indium-Zinc-Oxide (IZO).

Figure 3I:
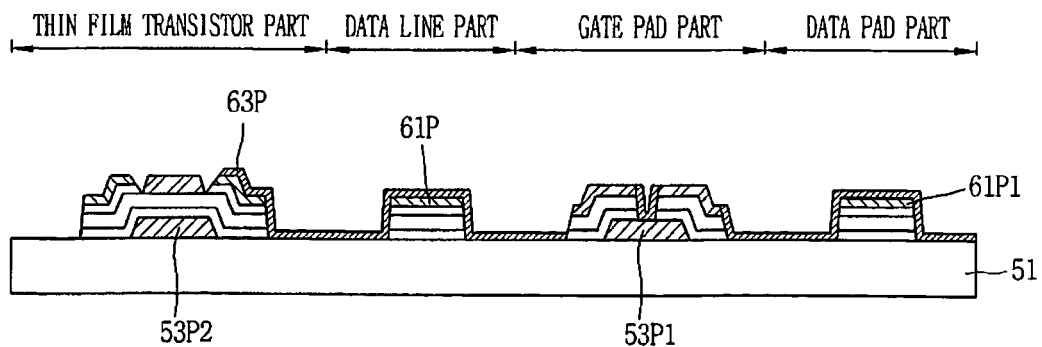

In FIGS. 2 and 3I, the fifth pattern 85P and the transparent conductive layer 63 provided on the fifth pattern 85P are selectively removed to form a pixel electrode 63P with the lift-off process. The pixel electrode 63P is connected with the drain electrode 61P3. When forming the pixel electrode 63P, the transparent conductive layer 63 is connected with the gate pad through the predetermined portion being opened in the gate pad part, and the transparent conductive layer 63 covers the data pad part and the data line part.

In the above process, the etch stopper 57P2 is formed on the active layer of the thin film transistor part. The etch stopper 57P2 may function as a passivation layer. The process of forming the passivation layer and a contact hole may be omitted and a number of masks is reduced.

As described above, the method for fabricating the LCD device uses the 3-mask process. The etch stopper which functions as the passivation layer is formed on the active layer of the thin film transistor part. As a result, an off-current of the thin film transistor is lowered and the reliability of the thin film transistor improves. The steps for forming the passivation layer and a contact hole may be omitted. The 3-mask process may omit processes of irradiating, stripping and cleaning for formation of the mask. The fabrication method is simplified. As a result, the 3-mask process provides lower fabrication cost and a better yield. The above embodiment is explained in connection with the fabrication method of the LCD device. However, it is available with other flat panel display devices such as organic light emitting display (OLED) devices.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalents of such metes and bounds are therefore intended to be embraced by the appended claims.

It is therefore intended that the foregoing detailed description be regarded as illustrative rather than limiting, and that it be understood that it is the following claims, including all equivalents, that are intended to define the spirit and scope of this invention.

I claim:

1. A method for fabricating a thin film transistor, comprising:
    forming a first metal layer and a first photoresist pattern on a substrate using a first mask;
    patterning the first metal layer using the first photoresist pattern to form a gate electrode on the substrate;
    forming an insulating layer, a silicon layer and an etch-stopper layer on the substrate;
    forming a second photoresist pattern which has a different thickness on the etch-stopper layer using a second mask;
    patterning the insulating layer, the silicon layer and the etch-stopper layer using the second photoresist pattern to form an active pattern and a preliminary etch-stopper;
    ashing the second photoresist pattern to form a third photoresist pattern;
    patterning the preliminary etch-stopper using the third photoresist pattern to form an etch stopper;
    forming an ohmic contact layer and a second metal layer on the substrate including the third photoresist pattern and the etch-stopper;
    removing the third photoresist pattern with the ohmic contact layer and the second metal layer over the third photoresist pattern;
    forming a fourth photoresist pattern on the substrate using a third mask;
    patterning a remaining second metal layer using the fourth photoresist pattern to form a source electrode and a drain electrode;
    ashing the fourth photoresist pattern to form a fifth photoresist pattern;
    forming a transparent conductive layer on the substrate; and
    removing the fifth photoresist pattern overlying the active pattern to form a pixel electrode.

2. The method of claim 1, wherein the second photoresist pattern corresponding to a channel formation part is relatively thicker than the second photoresist pattern corresponding to the source and drain electrodes.

3. The method of claim 2, wherein the etch stopper covers the channel formation portion of the active pattern.

4. A method for fabricating an LCD device comprising:
    preparing an insulating substrate defined with a thin film transistor part, a data line part, a gate pad part, and a data pad part;
    forming a first metal layer and a first photoresist pattern on the insulating substrate using a first mask;
    patterning the first metal layer using the first photoresist pattern to form a gate line on the insulating substrate, wherein the gate line includes a gate electrode formed in the thin film transistor part, and a gate pad formed in the gate pad part;
    forming an insulating layer, a silicon layer and an etch-stopper layer on the insulating substrate from which the first photoresist pattern are removed;
    forming a second photoresist pattern which has a different thickness on the etch-stopper layer using a second mask;
    patterning the insulating layer, the silicon layer and the etch-stopper layer using the second photoresist pattern to form an active pattern and a preliminary etch-stopper;
    ashing the second photoresist pattern to form a third photoresist pattern;
    patterning the preliminary etch-stopper using the third photoresist pattern to form an etch stopper;
    forming a data line which includes source and drain electrodes formed in the thin film transistor part, and a data pad formed in the data pad part with a third mask; and
    forming a pixel electrode connected with the drain electrode.

5. The method of claim 4, wherein
    the second photoresist pattern corresponding to a channel formation part is relatively thicker than the second photoresist pattern corresponding to the source and drain electrodes and
    wherein the second photoresist pattern corresponding to the gate pad part is relatively thicker than the second photoresist pattern corresponding to the data line part and the data pad part.

6. The method of claim 5, wherein the forming the source and drain electrodes includes:
    forming a second metal layer on the insulating substrate including the third photoresist pattern and the etch stopper;
    selectively removing the third photoresist pattern with the second metal layer positioned on the third photoresist pattern;
    forming a fourth photoresist pattern on the insulating substrate using the third mask, wherein the fourth photoresist pattern has a relatively thinner portion corresponding to the drain electrodes; and,
    patterning a remaining second metal layer using the fourth photoresist pattern to form a data line which includes source and drain electrodes formed in the thin film transistor part, and a data pad formed in the data pad part.

7. The method of claim 6, further comprising patterning the remaining second metal layer with a wet-etching process.

8. The method of claim 6, further comprising:

forming an ohmic contact layer on the insulating substrate including the third photoresist pattern and the etch stopper before forming the second metal layer.

9. The method of claim 6, wherein the forming the pixel electrode includes:

forming a fifth photoresist pattern by ashing the fourth photoresist pattern, wherein the fifth photoresist pattern is formed by removing a relatively thinner portion of the fourth photoresist pattern;

forming a transparent conductive layer on the insulating substrate including the fifth photoresist pattern; and selectively removing the fifth photoresist pattern with the transparent conductive layer positioned on the fifth photoresist pattern to form a pixel electrode.

10. The method of claim 9, further comprising lifting off the fifth photoresist pattern and the transparent conductive layer.

11. The method of claim 9, wherein the forming the pixel electrode comprises using the etch stopper as a passivation layer.

* * * * *